(12) United States Patent
Li et al.

(10) Patent No.: US 6,512,697 B1
(45) Date of Patent: Jan. 28, 2003

(54) CIRCUIT AND METHOD FOR SPEED AND STABILITY ENHANCEMENT FOR A SENSE AMPLIFIER

(75) Inventors: Hsiang-Pang Li, Jungli (TW); Yi-Te Shih, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/023,714

(22) Filed: Dec. 21, 2001

(30) Foreign Application Priority Data

Sep. 26, 2001 (TW) .......................... 90123847 A (51) Int. Cl.[7] .................. G11C 16/06; G11C 7/00; G11C 7/02
(52) U.S. Cl. ................. 365/185.21; 365/185.25; 365/205; 365/207
(58) Field of Search ................ 365/185.21, 185.25, 365/205, 207

(56) References Cited

U.S. PATENT DOCUMENTS

| | | | |
|---|---|---|---|
| 5,390,147 A | | 2/1995 | Smarandoiu et al. |
| 6,055,187 A | * | 4/2000 | Dallabora et al. ..... 365/185.21 |

* cited by examiner

*Primary Examiner*—David Nelms
*Assistant Examiner*—Ly Duy Pham
(74) *Attorney, Agent, or Firm*—Rabin & Berdo, P.C.

(57) ABSTRACT

A circuit and method for speed and stability enhancement for a sense amplifier comprises an offset current apparatus and a discharge current apparatus connected to a data node on one side of a transmission transistor that has another side with a sense node connected to a charge current apparatus and a leakage current apparatus with the leakage current mirrored from the offset current. The offset current ensures the transmission transistor not shut down and the voltage on the data node below a specific level, thereby enhancing the speed of the sense amplifier. The leakage current enhances the stability of the sense amplifier. Mirroring the leakage current from the offset current results good control of the operation and performance of the sense amplifier.

9 Claims, 9 Drawing Sheets

CIRCUIT AND METHOD FOR SPEED AND STABILITY ENHANCEMENT FOR A SENSE AMPLIFIER

FIELD OF THE INVENTION

The present invention relates generally to a sense amplifier for a semiconductor memory, and more particularly, to a circuit and method for speed and stability enhancement for a sense amplifier.

BACKGROUND OF THE INVENTION

Figure 1:
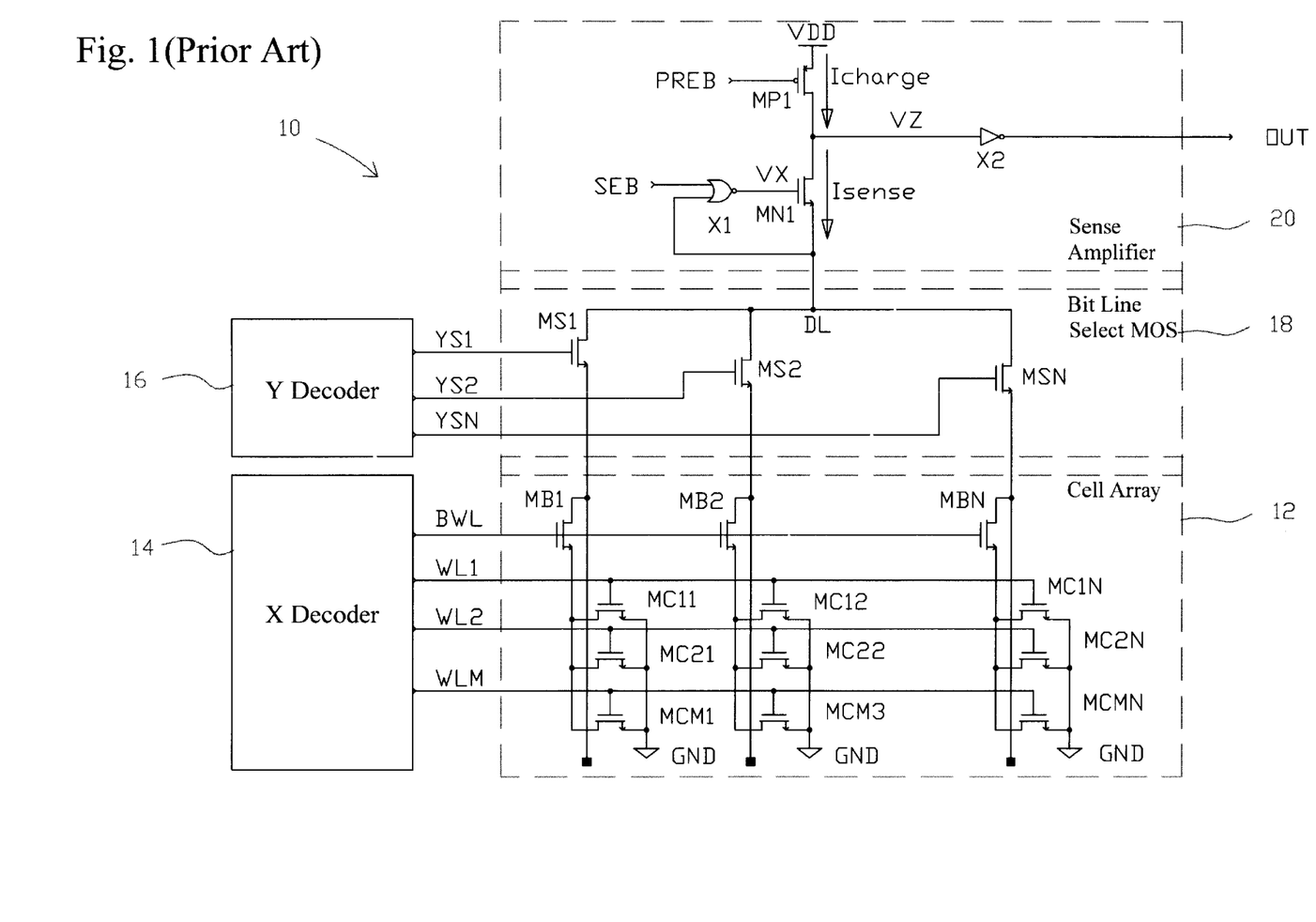
FIG. 1 shows the basic architecture of a typical semiconductor memory circuit.
Figure 2:
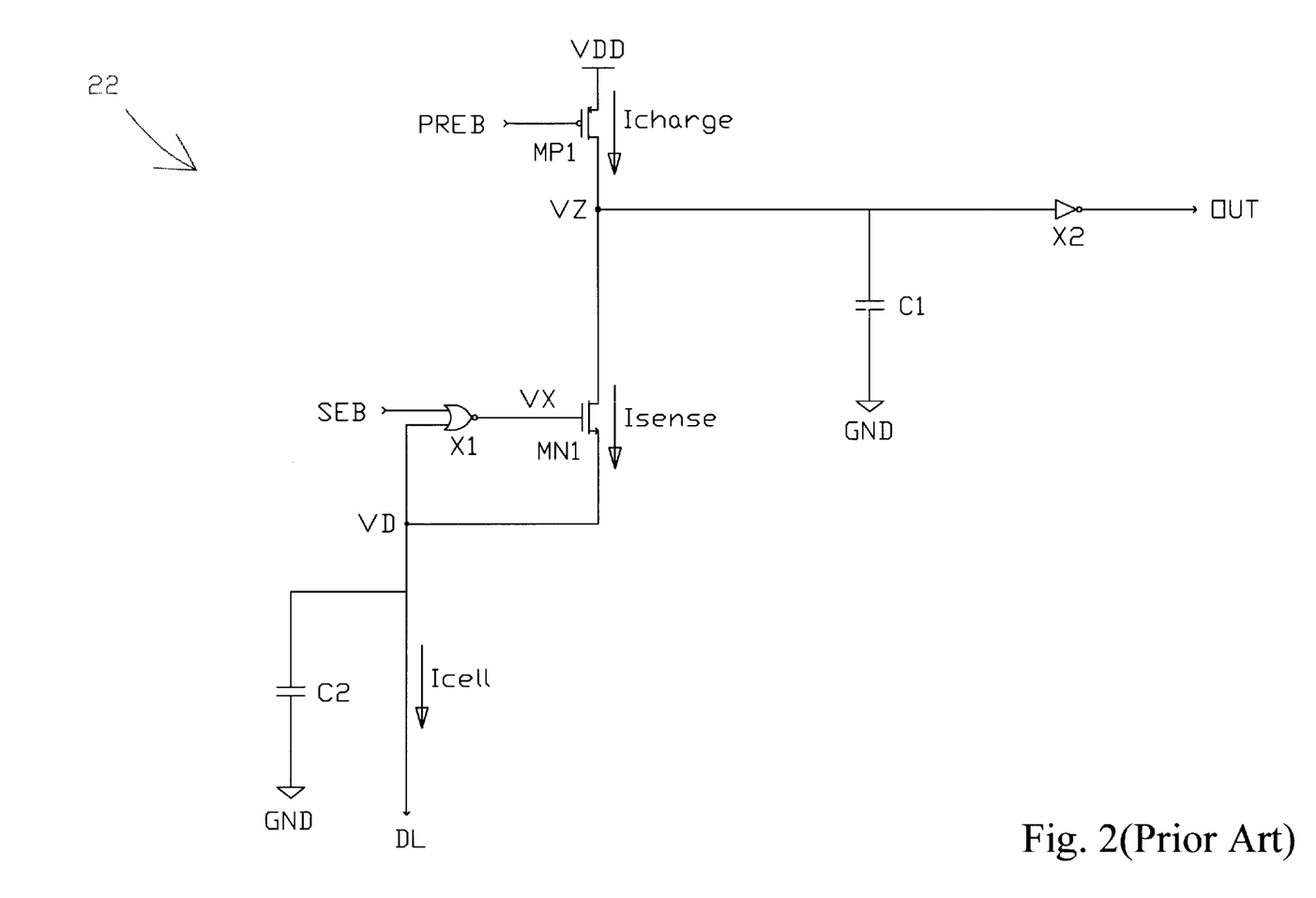
FIG. 2 is the circuit of the sense amplifier in FIG. 1.
Figure 3:
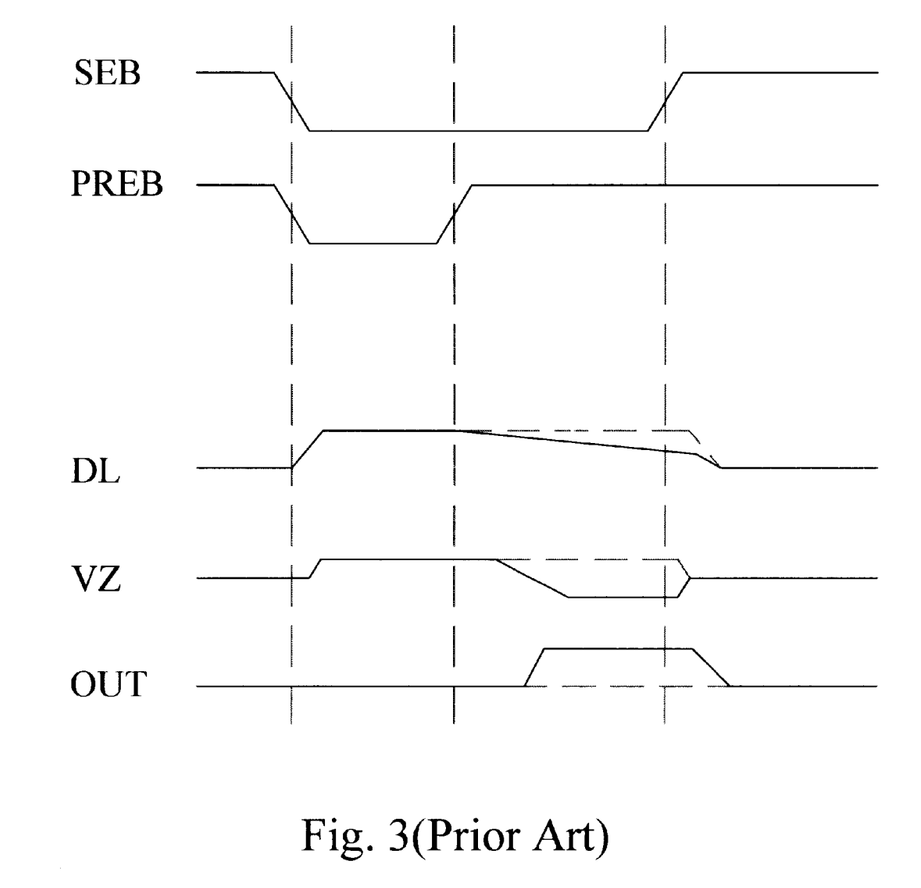
FIG. 3 is the timing diagram for the circuit shown in FIG. 2.

A sense amplifier is included in a semiconductor memory for read-out of data from memory cells, the speed and the stability of the sense amplifier thus dominate the performance of the memory. FIG. 1 is the architecture of a typical semiconductor memory circuit, which includes a cell array 12 consisting of a plurality of storage transistors that are illustratively shown only part of them for simplification. An X decoder 14 and a Y decoder 16 are employed for selection of a specific memory cell from the cell array 12 by word lines WL1, WL2 ..., WLM from the X decoder 14 and bit lines YS1, YS2, ..., YSN from the Y decoder 16 respectively in the column and row directions. The selected memory cell will be connected to a data line DL through a bit line select transistors 18 and then read out from the data line DL by a sense amplifier 20 to transmit a data signal OUT from the output of the sense amplifier 20. The basic operation of a sense amplifier is shown in FIG. 2, and the timing diagram is provided in FIG. 3. A sense amplifier 22 includes a transmission transistor MN1 separating a data node VD and a sense node VZ on two sides of the transistor MN1 with the data node VD connected to the data line DL to provide a path for read-out of data and the sense node VZ to transmit the data signal OUT through an output stage, for instance an inverter X2 herewith. The total capacitance seen from the data node VD and the sense node VZ are C1 and C2 respectively. When the selected memory cell is a conductive transistor, i.e., in a low state, there will be a cell current Icell appeared on the data line DL; contrarily, when the selected cell is a non-conductive transistor, i.e., in a high state, the cell current Icell on the data line DL is zero. During the sense amplifier 22 reading a low state, the data node VD is discharged by the cell current Icell and results in a sense current Isense conducted by the transmission transistor MN1, thus the voltage on the sense node VZ drops to a relative low level. During the sense amplifier 22 reading a high state, the cell current Icell is zero and the sense current Isense is zero or extremely small, such that the voltage on the sense node VZ is maintained a relative high level. When reading a low state, a time delay is present due to the transition of the transmission transistor MN1 from shut-down to turned-on, which induces a low sense speed. Furthermore, the speed to turn on the transmission transistor MN1 is even reduced for the voltage feedback from the data node VD to the transmission transistor MN1 through the NOR gate X1. On the other hand, when reading a high state, the transmission transistor MN1 could be undesired turned on by noise, thereby resulting in an unstable operation. Moreover, the data node VD could be overcharged to a very high level after several reading cycles, that will further reduces the turn-on speed of the transmission transistor MN1 and so the sense speed.

Figure 4:
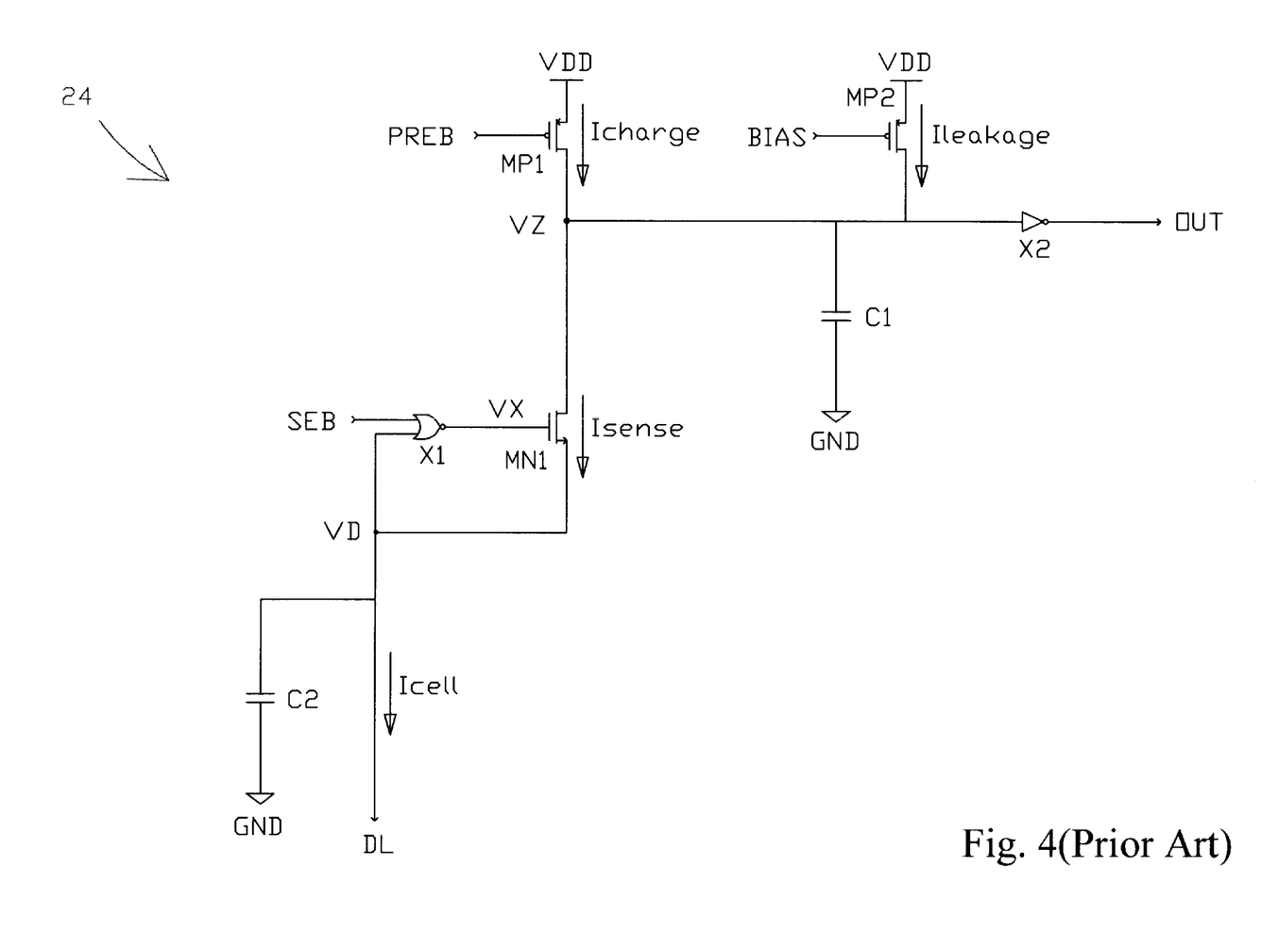
FIG. 4 shows the circuit of a conventional sense amplifier with improved stability.
Figure 5:
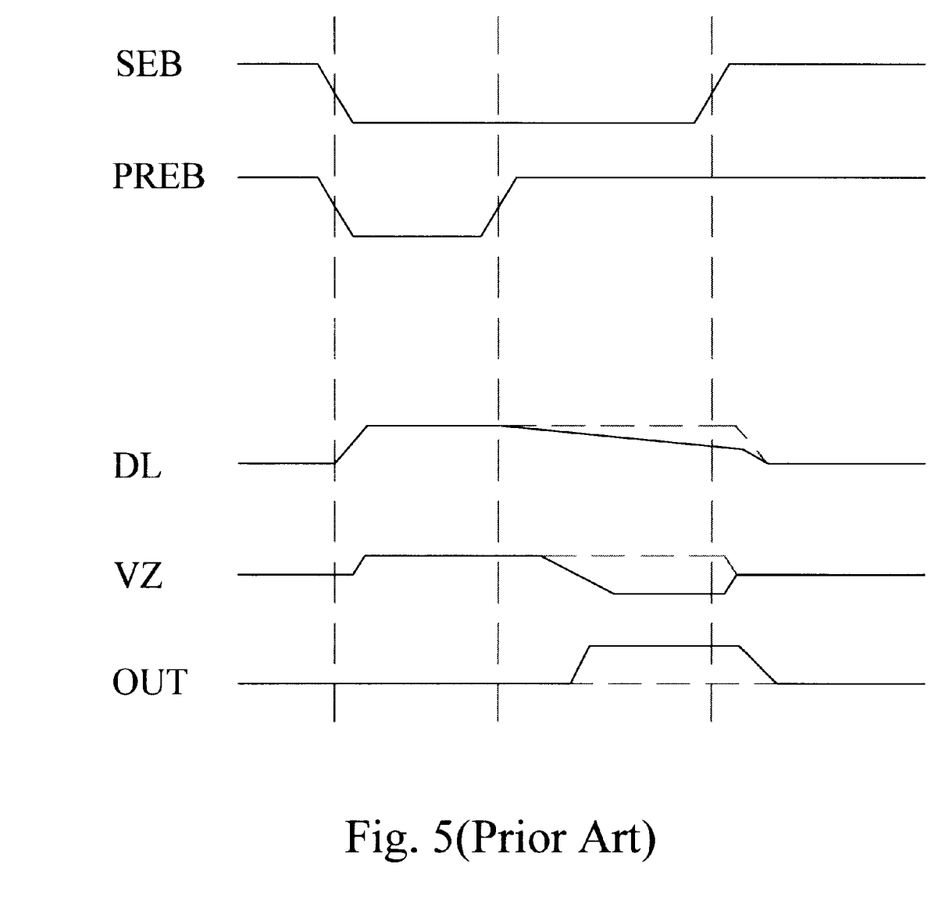
FIG. 5 is the timing diagram for the circuit shown in FIG. 4.

To enhance the stability of a sense amplifier, as shown in FIG. 4, a prior art applies an additional charging to the sense node VZ of the sense amplifier 24 by introduction of a current apparatus, and the timing diagram is shown in FIG. 5. A transistor MP2 is biased by a voltage BIAS to generate a leakage current for the sense node VZ to obtain a better stability.

Figure 6:
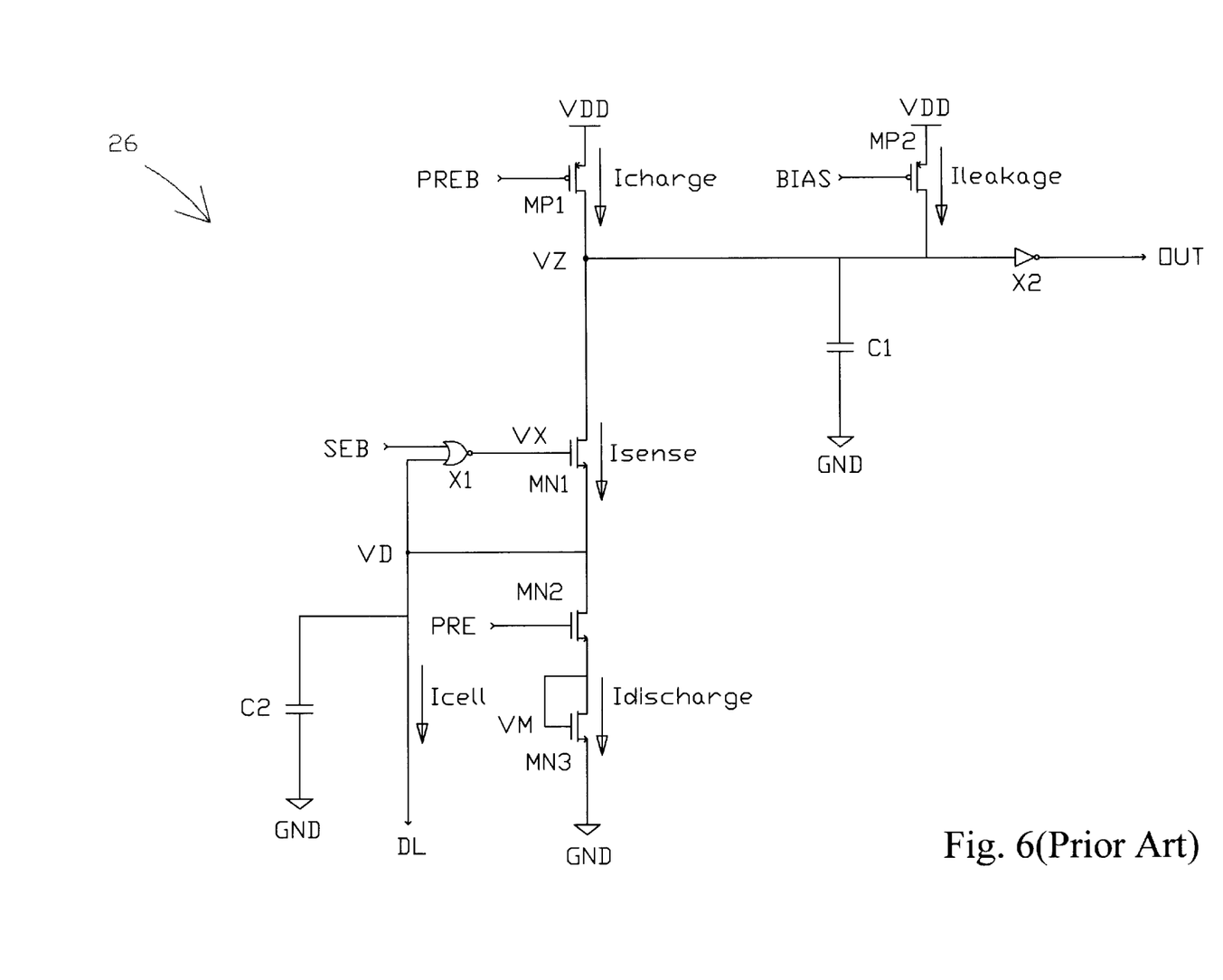
FIG. 6 shows the circuit of a conventional sense amplifier with improved sense speed.
Figure 7:
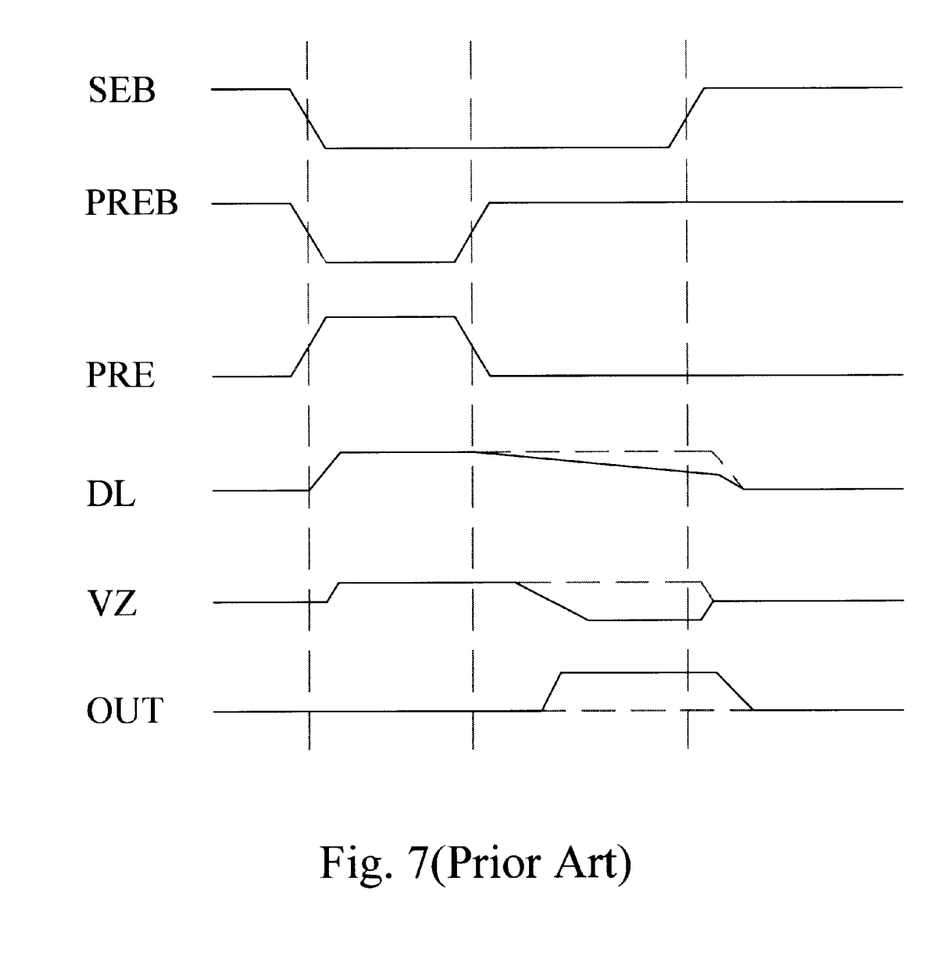
FIG. 7 is the timing diagram for the circuit shown in FIG. 6.

Another proposed arrangement is shown in FIG. 6, in which a discharge current apparatus MN3 is introduced into a sense amplifier 26 and connected to the data node VD under the control of a switch transistor MN2, and the timing diagram is shown in FIG. 7. The data node VD is discharged by the sense amplifier 26 during the precharge period to enhance the speed to turn on the transmission transistor MN1.

Smarandoiu et al. in U.S. Pat. No. 5,390,147 improve a sense amplifier with a lubrication current mirror connected to a data node and a reference node in combination with a feedback by a reference current mirror to enhance the speed of the sense amplifier. However, this manner the sense current is affected by the lubrication current and the reference current through the feedback in this arrangement. As a result, when not in an ideal situation, for example, the reference current variation due to the process drifting, a variation of the sense current will be induced, thereby reducing the sense speed and even a wrong sense result.

Therefore, it is desired a further improvement on a sense amplifier.

SUMMARY OF THE INVENTION

One object of the present invention is the sense speed and stability improvement of a sense amplifier by a connection of an offset current apparatus to the data node on one side of a transmission transistor to ensure that the transmission transistor does not shut down in the absence of current resulted from a memory cell and the data node will not be overcharged to a very high voltage so as to enhance the sense speed of the sense amplifier. A leakage current apparatus is further connected to the sense node on another side of the transmission transistor to improve the stability of the sense amplifier. The leakage current is derived from the offset current by a current mirror to obtain a good control of the operation and performance of the sense amplifier. There is also a discharge current apparatus connected to the data node to, compensate the leakage current from the transmission transistor.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION OF THE INVENTION

Figure 8:
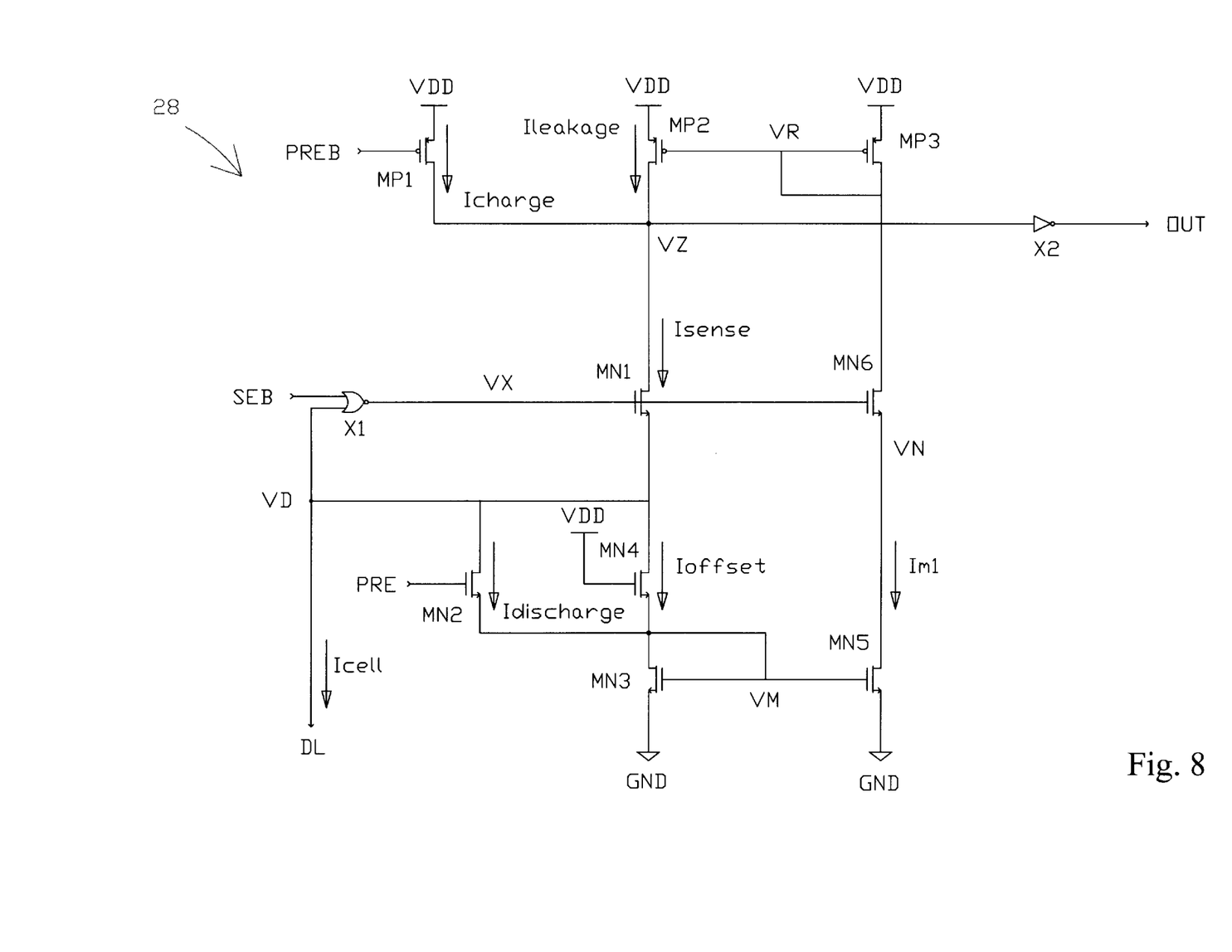
FIG. 8 shows an embodiment according to the present invention.
Figure 9:
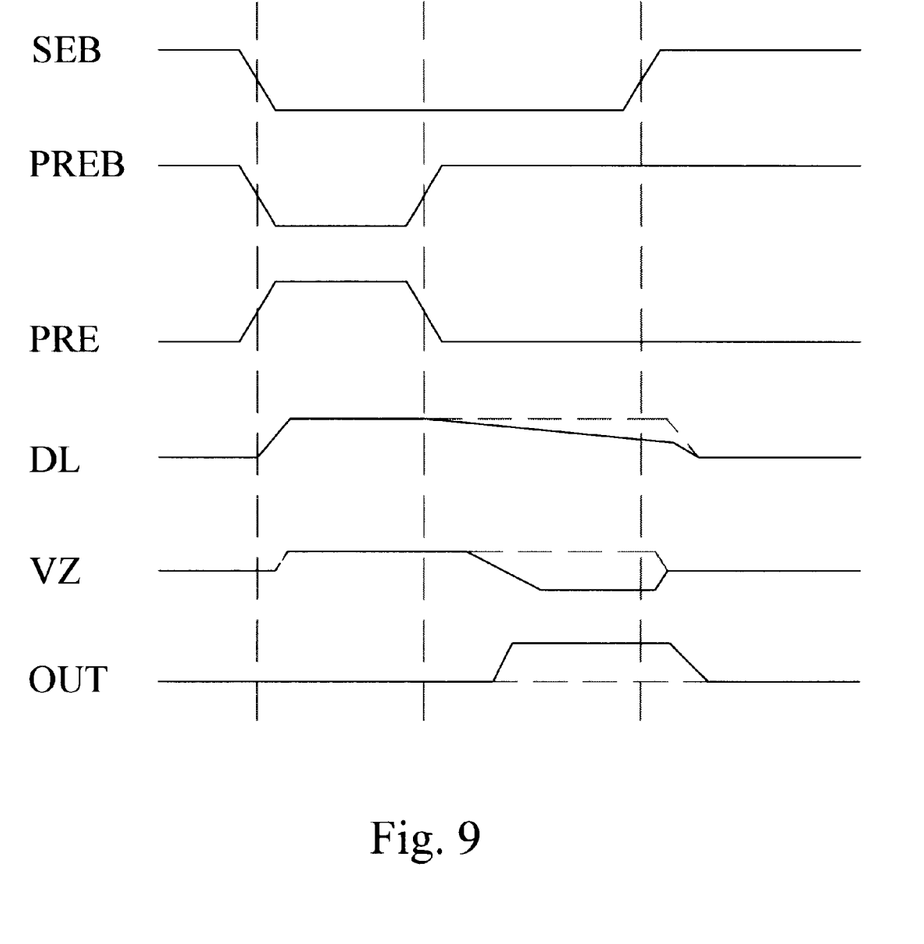
FIG. 9 is the timing diagram for the circuit shown in FIG. 8.

An embodiment according to the present invention for the sense amplifier is shown in FIG. 8 and the timing diagram for this circuit is shown in FIG. 9. Same as in the prior art, the sense amplifier 28 thereof comprises a transmission transistor MN1 with a source serving as an input connected to the data line DL through the data node VD, a drain serving as an output connected to the sense node VZ, and a gate connected to a node VX serving as a control node to receive the control signal from the complementary signal SEB of a sense enable signal and the signal on the data node VD through a NOR gate X1 to operate the transmission transistor MN1. When the transmission transistor MN1 is turned on, the memory state of a memory cell is sensed by means of the cell current Icell flowing on the data line DL to produce a corresponding voltage on the sense node VZ and transmit a memory signal OUT through a inverter X2.

As in the prior art, the sense amplifier 28 also comprises a charge current apparatus to enhance its speed. As shown in FIG. 8, a transistor MP1 has a source connected to a power supply voltage VDD, a drain connected to the sense node VZ, and a gate connected to an inverse of a signal PREB that is complementary to a precharge signal. When the transistor MP1 is turned on by the signal PREB, a charge current Icharge is supplied to the sense node VZ and data node VD for sense preparation and reduction of the sense time.

For further improvement of the sense speed, an offset current apparatus is connected to the data node VD as shown in the figure, of which a transistor MN4 with a drain connected to the data node VD and a gate connected to a power supply voltage VDD to generate an offset current Ioffset about 4 µA to 6 µA to ensure the transmission transistor MN1 not shut down and the voltage of the data node VD below a specific level for increase of the sense speed. Different from the prior art, the offset current Ioffset independently control the transmission transistor MN1 and is independent with the memory reference cell and the reference current. In addition, the offset current Ioffset is determined by the size and the gate bias of the transistor MN4, so it is easy to be selected by the circuit designer.

A pair of current mirrors including a master current mirror and a slave current mirror is employed to generate a leakage current in reference to the offset current Ioffset for the sense node VZ. The master current mirror is composed of transistors MN3 and MN5 with their gates connected to each other and the drain of the transistor MN3, and their sources grounded. The input of the master current mirror, i.e., the drain of the transistor MN3 is connected to the source of the transistor MN4 to receive the offset current Ioffset. Due to the mirroring by the master current mirror, an intermediate current Im1 is conducted by the transistor MN5 with a ratio of the offset current Ioffset to the mirrored current Im1 dependent on the size ratio of the transistor MN3 to the transistor MN5, which is about 1 to 3/4 in this embodiment. On the other hand, the slave current mirror is composed of transistors MP3 and MP2 with their sources connected to a power supply voltage VDD, their gates connected to each other and the drain of the transistor MP3, and the drain of the transistor MP2 connected to the sense node VZ. Between the master and slave current mirrors is inserted with a transistor MN6 common gated to the transmission transistor MN1, and the source and drain of the transistor MN6 are connected respectively to the output of the master current mirror, i.e., the drain of the transistor MN5, and the input of the slave current mirror, i.e., the drain of the transistor MP3. When the transistor MN6 is turned on, the current Im1 conducted by the transistor MN5 flows through the transistor MP3, and a leakage current Ileakage is generated on the transistor MP2 to supply to the sense node VZ due to the mirroring by the slave current mirror. The ratio of the intermediate current Im1 to the mirrored leakage current Ileakage is determined by the size ratio of the transistor MP3 to the transistor MP2, which is about 1 in this embodiment. On the contrary, the master and slave current mirrors will lose there functions as described in the above if the transistor MN6 is turned off. The leakage current Ileakage charging the sense node VZ enables the sense amplifier 28 against the noise in the circuit and thus improves the stability of the sense amplifier 28. The ability of the sense node VZ against noise is determined by the magnitude of the leakage current Ileakage. For the correspondence between the master and slave current mirrors by means of the intermediate current Im1, the leakage current Ileakage is proportional to the offset current Ioffset and the ratio of the offset current Ioffset to the leakage current Ileakage depends on the size ratios of the transistors MN3 to MN5 and MP3 to MP2, which is in the range of 1 to 4/3 in this embodiment. Different from the prior art, the stability of the sense amplifier 28 is improved by the introduction of the leakage current Ileakage that is generated by mirroring the offset current Ioffset and proportional to the offset current Ioffset so as not to be affected by other factors such as the process variations.

In addition, the data node VD is connected with a discharge current apparatus, i.e., a transistor MN2 with its gate connected to a precharge signal PRE and its source connected to the input of the master current mirror, that is, the drain of the transistor MN3. When the transistor MN2 is turned on by the signal PRE, it conducts a discharge current Idischarge with the same magnitude as the leakage current Ileakage to compensate the leakage current Ileakage from the transmission transistor MN1.

When sensing a low state, i.e., a conductive memory cell, there will be a cell current Icell flowing from the data node VD to the selected memory cell, the data node VD is thus discharged by the cell current Icell and a sense current Isense is present on the transmission transistor MN1, resulting in a relative low voltage on the sense node VZ. Contrarily, when sensing a high state, i.e., a non-conductive memory cell, the cell current Icell flowing from the data node VD to the selected memory cell is zero, on the data node VZ is thus maintained a relative high voltage, and even a noise current is residued on the memory cell or data line DL, the transistor MP2 will provides a leakage current Ileakage to compensate the noise current, such that the stability and the ability to against the noise are improved.

When the data node VD is charged, it will not be overcharged in the present of the offset current Ioffset and is maintained below a specific voltage, which is the sum of the drain-source voltage difference VDS for the transistor MN4 and the gate-source voltage difference VGS for the transistor MN3 and is about 1 volt. In this manner, the sense speed will not slow down on the next read cycle. Even there is no current on the data line DL, the offset current Ioffset still prevents the transmission transistor MN1 from shut down, thereby increasing the sense speed on the next read cycle since the transmission transistor MN1 will be turned on faster.

In a sense cycle, as shown in FIG. 9, during the precharge period the transistor MP1 of the charge current apparatus is turned on by the signal PREB to conduct a charge current Icharge to charge the sense node VZ and the data node VD and the transistor MN2 of the discharge current apparatus is turned on by the signal PRE to conduct a discharge current Idischarge to discharge the data node VD so as to prevent it from overcharged by the charge current Icharge. After the precharge period, the voltage on the data node VD, i.e., the voltage on the data line DL gradually drops to a specific level, then the control signal VX from the NOR gate X1 raises, resulting in that the voltage on the sense node VZ drops rapidly and a data signal OUT will be produced.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A circuit for speed and stability enhancement for a sense amplifier including a transmission transistor with an output coupled to a sense node and an input coupled to a data node connecting a data line to sense a memory state of a memory cell and transmit a data signal from said sense node through an output buffer, said circuit comprising:

a first current mirror with a first and a second branches for mirroring a intermediate current on said second branch from said first branch, between said first branch and data node inserted with an offset current apparatus controlled by a first control signal to conduct an offset current;

a second current mirror with a third branch for mirroring a leakage current in response to said intermediate current and a forth branch coupled to said sense node; and a charge current apparatus coupled to said sense node and controlled by an inverse signal of a second control signal to conduct a charge current.

2. A circuit according to claim 1 wherein said first control signal is a power supply voltage.

3. A circuit according to claim 1 wherein said first current mirror has a mirror ratio ranged from 1 to 4/3.

4. A circuit according to claim 1 wherein said second current mirror has a mirror ratio of 1.

5. A circuit according to claim 1 wherein said offset current to said leakage current has a ratio ranged from 1 to 4/3.

6. A circuit according to claim 1 further comprising a discharge current apparatus inserted between said data node and first branch of said first current mirror and controlled by a third control signal to conduct a discharge current.

7. A circuit according to claim 6 wherein said third control signal is a complementary to said second control signal.

8. A circuit according to claim 6 wherein said charge current to said discharge current has a ratio ranged from 5 to 10.

9. A circuit according to claim 1 further comprising an intermediate transistor common gated to said transmission transistor with a source connected to said second branch of said first current mirror, and a drain connected to said third branch of said second current mirror.

* * * * *